US010281637B2

(12) United States Patent
Chen et al.

(10) Patent No.: US 10,281,637 B2
(45) Date of Patent: May 7, 2019

(54) PIXEL STRUCTURE COMPRISING A WAVELENGTH CONVERSION LAYER AND A LIGHT COLLIMATING LAYER HAVING A REFLECTION PART AND A TRANSMISSION PART AND DISPLAY PANEL HAVING THE SAME

(71) Applicant: AU Optronics Corporation, Hsin-Chu (TW)

(72) Inventors: Yu-Chao Chen, Hsin-Chu (TW); Hsing-Yi Hsieh, Hsin-Chu (TW); Chen-Hsien Liao, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/841,580

(22) Filed: Dec. 14, 2017

(65) Prior Publication Data
US 2018/0203294 A1    Jul. 19, 2018

(30) Foreign Application Priority Data
Jan. 16, 2017   (TW) .............................. 106101445 A

(51) Int. Cl.
*F21V 8/00* (2006.01)
*G02B 27/30* (2006.01)
(Continued)

(52) U.S. Cl.
CPC ........... *G02B 6/0026* (2013.01); *G02B 27/30* (2013.01); *G02F 1/133514* (2013.01);
(Continued)

(58) Field of Classification Search
CPC ....... G02F 1/1343; G02F 2001/133548; G02F 2001/01791; G09G 2300/0439; G02B 6/0026
See application file for complete search history.

(56) References Cited

U.S. PATENT DOCUMENTS 8,582,057 B2    11/2013  Jung et al.
2009/0072259 A1   3/2009  Chen et al.
(Continued)

FOREIGN PATENT DOCUMENTS

CN    103412435 A    11/2013
CN    104538842 A    4/2015
(Continued)

OTHER PUBLICATIONS

Taiwan Patent Office "Office Action" dated Jun. 29, 2017, Taiwan ROC.

*Primary Examiner* — Paul C Lee
(74) *Attorney, Agent, or Firm* — WPAT, PC

(57) ABSTRACT

A pixel structure includes a first substrate, a plurality of thin film transistors, a wavelength conversion layer, and a metal grating polarizer layer. The thin film transistors are disposed on an inner surface of the first substrate. The metal grating polarizer layer is disposed on the plurality of thin film transistors. The wavelength conversion layer is disposed between the inner surface of first substrate and the metal grating polarizer layer. The wavelength conversion layer is configured to receive a light beam between the wavelength conversion layer and the first substrate and convert the light beam into a light wavelength band corresponding to the wavelength conversion layer.

16 Claims, 9 Drawing Sheets

(51) Int. Cl.
    *G02F 1/017*         (2006.01)
    *H01L 33/50*        (2010.01)
    *G02F 1/1335*      (2006.01)

(52) U.S. Cl.
    CPC .. G02F 1/133602 (2013.01); G02F 1/133617 (2013.01); H01L 33/50 (2013.01); *G02F 1/133528* (2013.01); *G02F 2001/01791* (2013.01); *G02F 2001/133548* (2013.01); *G02F 2001/133614* (2013.01); *G09G 2300/0439* (2013.01); *H01L 2933/0041* (2013.01)

(56) References Cited

U.S. PATENT DOCUMENTS

| | | | |
|---|---|---|---|
| 2010/0277887 A1 | 11/2010 | Su et al. | |
| 2013/0033662 A1* | 2/2013 | Chung | G02F 1/133528 349/96 |
| 2013/0335677 A1* | 12/2013 | You | G02F 1/133609 349/65 |
| 2013/0341605 A1 | 12/2013 | Yoo et al. | |
| 2014/0016043 A1 | 1/2014 | Chen et al. | |
| 2014/0204128 A1* | 7/2014 | Jiang | G02F 1/133617 345/690 |
| 2015/0014693 A1* | 1/2015 | Lee | H01L 27/124 257/72 |
| 2015/0109560 A1 | 4/2015 | Guo et al. | |
| 2015/0228232 A1* | 8/2015 | Lee | G09G 3/3607 345/88 |
| 2015/0380671 A1 | 12/2015 | Shu et al. | |
| 2016/0223870 A1* | 8/2016 | Miki | G02F 1/133617 |

FOREIGN PATENT DOCUMENTS

| | | |
|---|---|---|
| TW | 201041190 A | 11/2010 |
| TW | 201314952 A | 4/2013 |

* cited by examiner

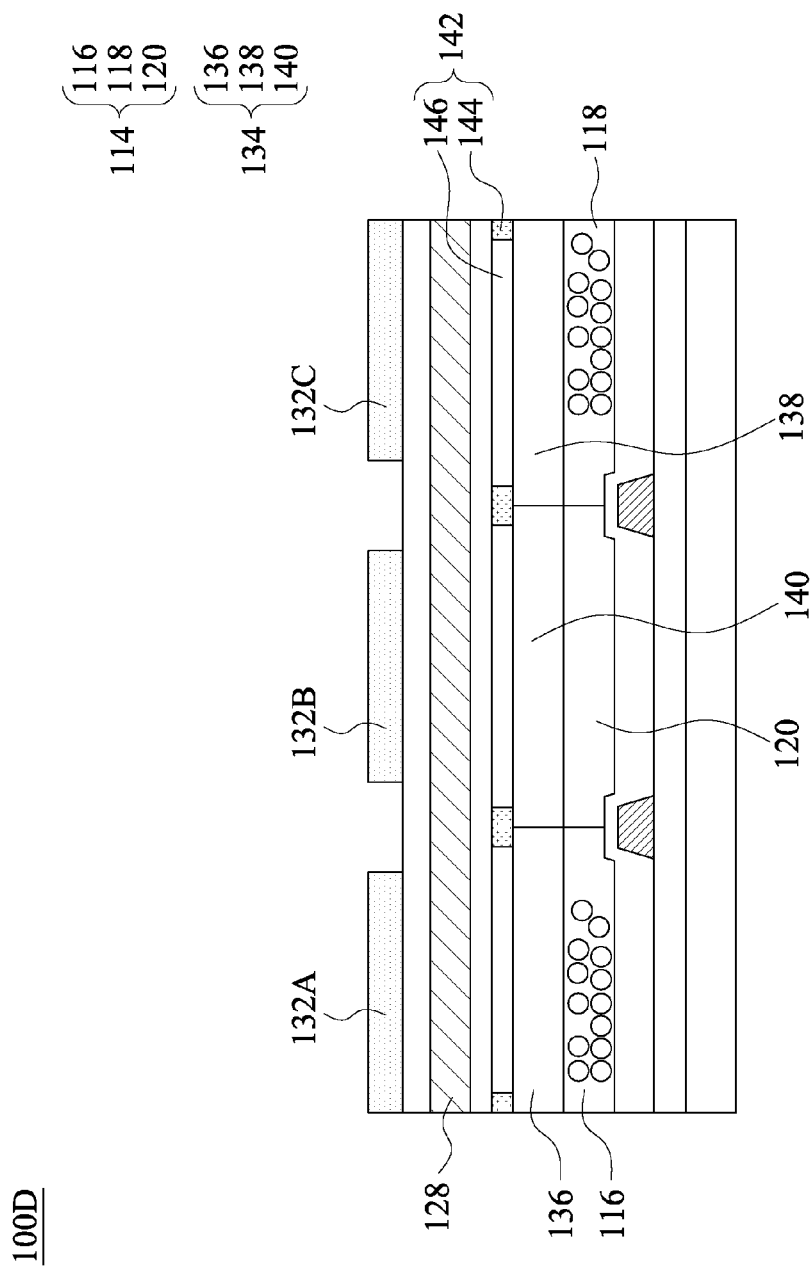

ural application claims priority to and# PIXEL STRUCTURE COMPRISING A WAVELENGTH CONVERSION LAYER AND A LIGHT COLLIMATING LAYER HAVING A REFLECTION PART AND A TRANSMISSION PART AND DISPLAY PANEL HAVING THE SAME

CROSS-REFERENCE TO RELATED APPLICATION

This non-provisional application claims priority to and benefit of, under 35 U.S.C. § 119(a), Patent Application No. 106101445 filed in Taiwan R.O.C. on Jan. 16, 2017, the entire contents of which are hereby incorporated by reference.

BACKGROUND

Technical Field

The present disclosure relates to a pixel structure and a display apparatus having the pixel structure.

Related Art

Thin film transistor (TFT) type liquid crystal displays have been widely used. A thin film transistor type liquid crystal display is mainly formed by a thin film transistor array substrate, a color filter array substrate, and a liquid crystal layer, wherein a plurality of thin film transistors arranged in an array and pixel electrodes configured corresponding to the thin film transistors are disposed on the thin film transistor array substrate.

Further, resolution and degree of color contrast required by liquid crystal displays have been increasingly improved. Therefore, finding a next new technical solution to achieve good display quality is really one of current important research and development subjects, and also becomes a target of improvement in related fields currently.

SUMMARY

An embodiment of the present disclosure provides a pixel structure, comprising a first substrate, a plurality of thin film transistors, a wavelength conversion layer, and a metal grating polarizer layer. The thin film transistors are disposed on an inner surface of the first substrate. The metal grating polarizer layer is disposed on the plurality of thin film transistors. The wavelength conversion layer is disposed between the inner surface of first substrate and the metal grating polarizer layer, wherein the wavelength conversion layer is configured to receive a light beam between the wavelength conversion layer and the first substrate and convert the light beam into a light wavelength band corresponding to the wavelength conversion layer.

According to some embodiments of the present disclosure, the pixel structure further comprises a flat layer. The flat layer is disposed between the wavelength conversion layer and the metal grating polarizer layer.

According to some embodiments of the present disclosure, the pixel structure further comprises a color filter layer. The color filter layer is disposed between the wavelength conversion layer and the metal grating polarizer layer.

According to some embodiments of the present disclosure, the wavelength conversion layer further comprises a first conversion part and a second conversion part. The first conversion part is configured to receive the light beam, and convert the light beam into a first wavelength. The second conversion part is configured to receive the light beam, and convert the light beam into a second wavelength.

According to some embodiments of the present disclosure, the color filter layer further comprises a first filter part and a second filter part. The first filter part is disposed on the first conversion part. The second filter part is disposed on the second conversion part.

According to some embodiments of the present disclosure, the pixel structure further comprises a light collimating layer. The light collimating layer is disposed between the pixel electrode and the wavelength conversion layer, wherein the light collimating layer further comprises a reflection part and a transmission part.

According to some embodiments of the present disclosure, the wavelength conversion layer comprises a first conversion part and a second conversion part; the first conversion part is configured to receive the light beam, and convert the light beam into a first wavelength; the second conversion part is configured to receive the light beam, and convert the light beam into a second wavelength; the light collimating layer is disposed above the wavelength conversion layer, and a vertical projection of the reflection part on the wavelength conversion layer is located on a boundary between the first conversion part and the second conversion part.

According to some embodiments of the present disclosure, the reflection part has a first refractive index; the transmission part has a second refractive index; and the second refractive index is greater than the first refractive index.

According to some embodiments of the present disclosure, the wavelength conversion layer directly contacts the light collimating layer; the wavelength conversion layer has a third refractive index; and the third refractive index is greater than or equal to the second refractive index.

According to some embodiments of the present disclosure, a ratio of the first refractive index to the third refractive index is between 0.7 and 0.9.

According to some embodiments of the present disclosure, the pixel structure further comprises a color filter layer. The color filter layer is disposed between the wavelength conversion layer and the light collimating layer; the color filter layer directly contacts the light collimating layer; the color filter layer has a third refractive index; and the third refractive index is greater than the second refractive index.

According to some embodiments of the present disclosure, the pixel structure further comprises a light shield layer, wherein the wavelength conversion layer comprises a first conversion part and a second conversion part; the first conversion part is configured to receive the light beam, and convert the light beam into a first wavelength; the second conversion part is configured to receive the light beam, and convert the light beam into a second wavelength; and a vertical projection of the light shield layer on the wavelength conversion layer is located on a boundary between the first conversion part and the second conversion part.

According to some embodiments of the present disclosure, the pixel structure further comprises a plurality of pixel electrodes, disposed on the inner surface of the first substrate, and the plurality of pixel electrodes is respectively electrically connected to the corresponding thin film transistors, wherein the metal grating polarizer layer is disposed between the wavelength conversion layer and the pixel electrodes.

According to some embodiments of the present disclosure, the metal grating polarizer layer comprises a plurality of blocks separated from each other, and each of the blocks separated from each other is electrically connected to one of the corresponding plurality of thin film transistors, and the metal grating polarizer layer is used as a pixel electrode.

According to some embodiments of the present disclosure, the pixel structure further comprises a second substrate and another metal grating polarizer layer. The second substrate is disposed opposite to the first substrate. The other metal grating polarizer layer is disposed on a surface of the second substrate.

According to one of embodiments of the present disclosure provides a display panel, comprising a pixel structure, a second substrate, and a display medium layer. The second substrate is disposed opposite to the first substrate. The display medium layer is disposed between the first substrate and the second substrate.

BRIEF DESCRIPTION OF THE DRAWINGS

FIG. 5 is a schematic sectional view of a pixel structure according to a fourth embodiment of the present disclosure, wherein a sectional location of FIG. 5 is the same as that of FIG. 1B.

DETAILED DESCRIPTION

Figure 1A:
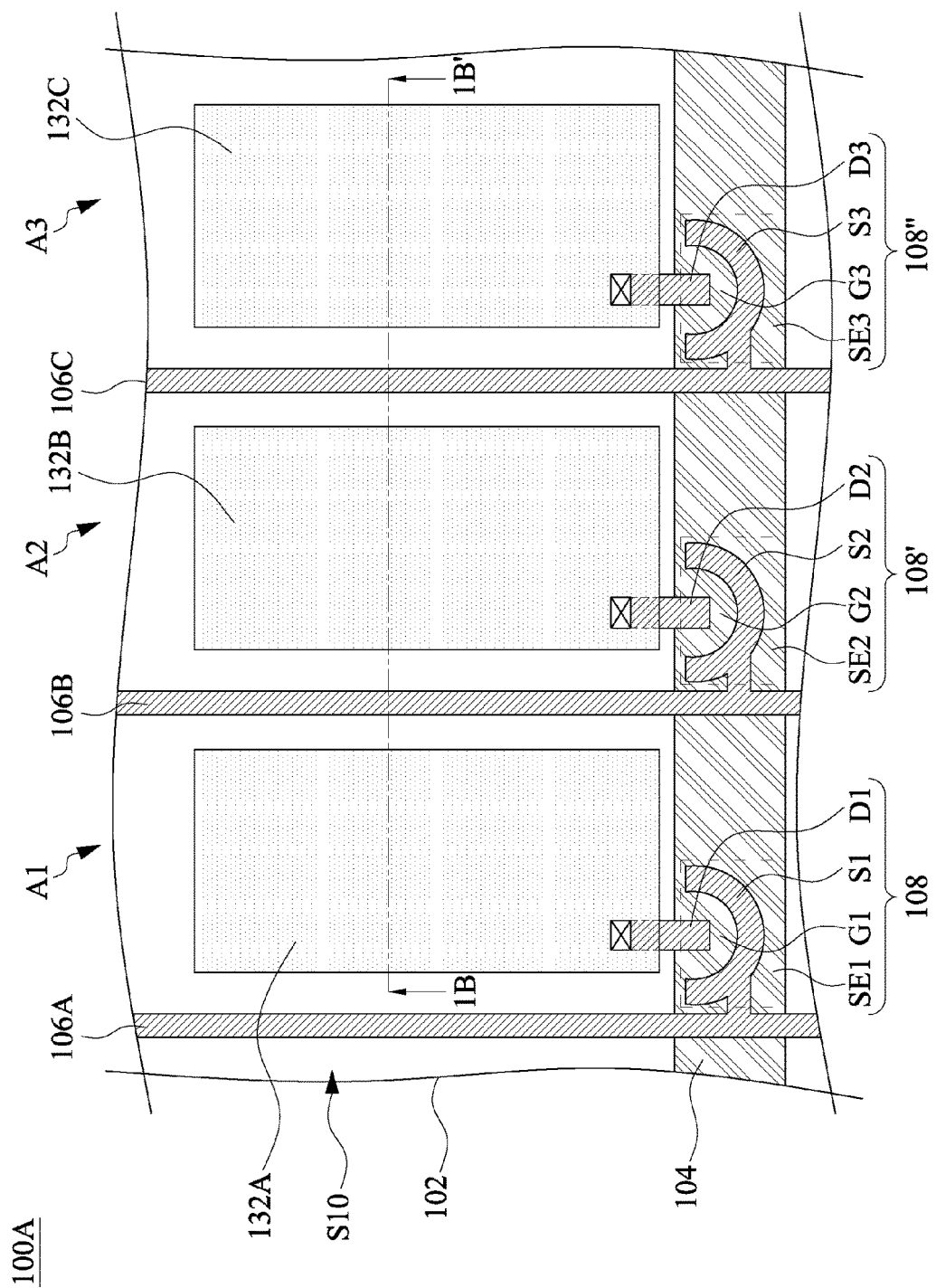
FIG. 1A is a schematic top view of a pixel structure according to a first embodiment of the present disclosure.

Various embodiment of the present disclosure are disclosed below with accompanying drawings. To make the description clear, a lot of practical details are described together in the following description. However, it should be known that the practical details should not be intended to limit the present disclosure. That is, in some embodiments of the present disclosure, the practical details are unnecessary. In addition, to simplify drawings, some conventional structures and elements are drawn in a simple illustrative manner in the drawings.

However, some embodiments may be implemented in a case in which the embodiments are combined with other methods and structures known in the prior art. In the following description, specific details such as specific structures, sizes, and related optical designs are indicated to provide though understanding of the present disclosure. In other cases, semiconductor structures and manufacturing known in the prior art are not specifically described in detail to prevent the description from unnecessarily blurring the present disclosure. "The present embodiment" mentioned in the entire specification refers to at least one embodiment of specific structures, sizes, and related optical designs included in the present disclosure. Therefore, "the present embodiment" that occurs in a plurality of places of the entire specification does not necessarily refer to the same embodiment. In addition, specific structures, sizes, and related optical designs or attributes may be combined into one or more embodiments in any suitable manner.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. However, the electrical connection can means an element located between two devices.

"Cross.", "above . . . ", "to", "between . . . ", and "on . . . " used in the present specification may refer to a relative location of one layer relative to another layer. One layer "crosses" "above", "on", "connected to" or "contacts" another layer, is one layer directly contacts another layer or may have one or more intermediate layers. One layer "between" a plurality of layers is one layer directly contacts the plurality of layers or may have one or more intermediate layers.

"About" or "substantially" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, ±10%, ±5%, or others of the stated value. Furthermore, "about", "approximate" or "substantially" acceptable range of deviation or standard deviation may be selected in terms of optical properties, etch properties, or other properties, and may not apply one standard deviation to the all properties.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 1B:
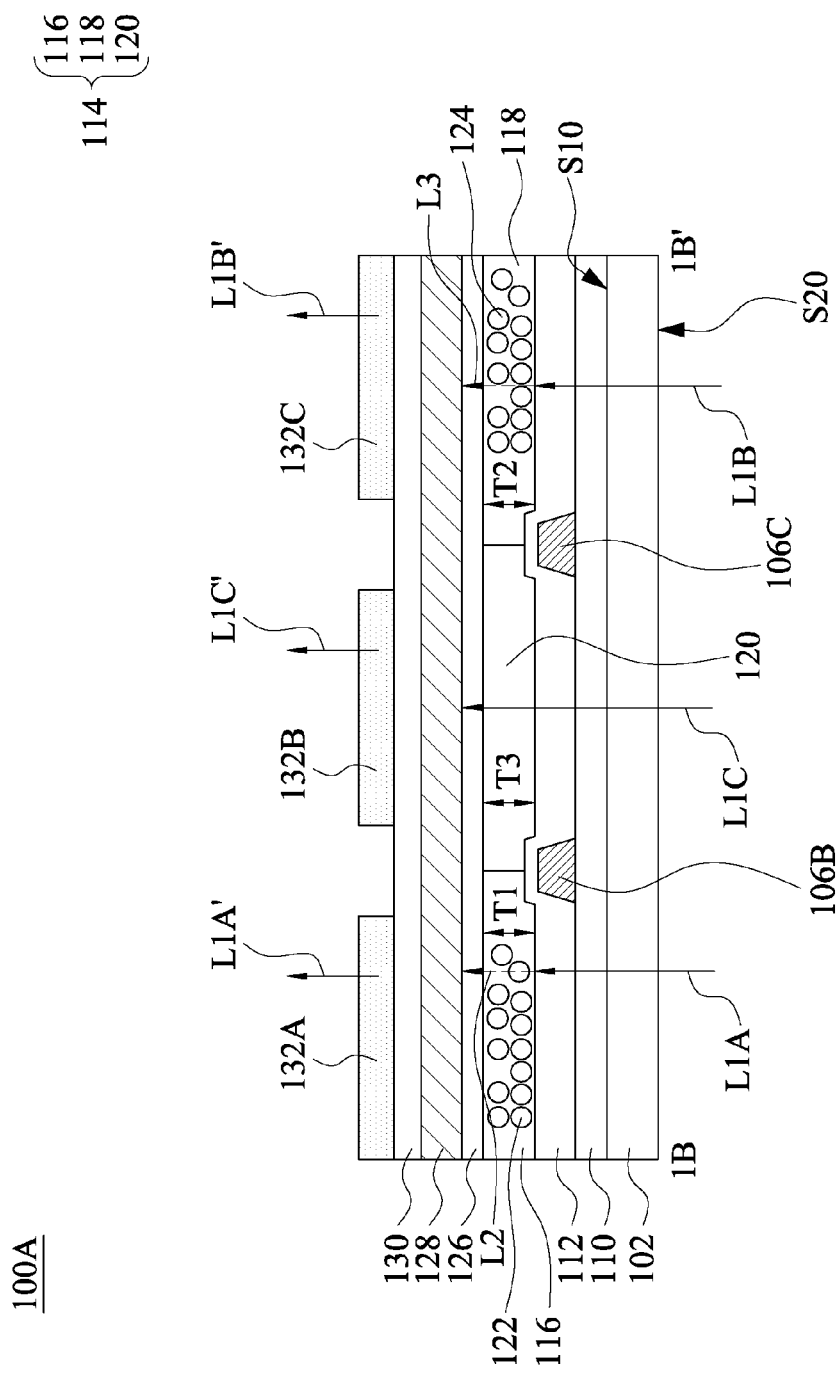
FIG. 1B is a schematic sectional view of a pixel structure of FIG. 1A along a line segment 1B-1B'.

Referring to FIG. 1A and FIG. 1B at the same time, FIG. 1A is a schematic top view of a pixel structure 100A according to a first embodiment, and FIG. 1B is a schematic sectional view of the pixel structure 100A of FIG. 1A along a line segment 1B-1B'. The pixel structure 100A of FIG. 1A uses a design of a single sub pixel (for example: a sub pixel 132A, 132B, or 132C) as an example, but the present disclosure is not limited thereto. In other embodiments, the pixel structure 100A may also comprise other types of sub pixel designs, for example, a single sub pixel comprises a main pixel electrode and a sub pixel electrode respectively corresponding to a main pixel structure and a sub pixel structure, and the main pixel electrode and the sub pixel electrode are respectively controlled by substantively same or different voltages to achieve different display effects. The present disclosure is not limited thereto. The pixel structure 100A of the present disclosure comprises a first substrate 102, a scanning line 104, data lines (for example, data lines 106A, 106B, and 106C), thin film transistors (for example, thin film transistors 108, 108', and 108"), a wavelength conversion layer 114, a metal grating polarizer layer 128, and pixel electrodes (for example, pixel electrodes 132A, 132B, and 132C). The sectional view shown in FIG. 1B is merely one of possible embodiments. For example, the pixel structure 100A comprises the first substrate 102, the scanning line 104, the data lines 106A, 106B, and 106C, the thin film transistors (for example, the thin film transistors 108, 108', and 108"), a first insulation layer 110, a second insulation layer 112, the wavelength conversion layer 114, a flat layer 126, the metal grating polarizer layer 128, a third insulation layer 130, and the pixel electrodes 132A, 132B, and 132C.

The first substrate 102 has an inner surface S10 and an outer surface S20 opposite to each other, and the scanning line 104 and the first insulation layer 110 are disposed on the inner surface S10 of the first substrate 102. The data lines 106A, 106B, and 106C are disposed on the first insulation layer 110, and a vertical projection of the scanning line 104 on the first substrate 102 intersects with vertical projections of the data lines 106A, 106B, and 106C on the first substrate 102, so as to define at least one pixel area (for example, pixels areas A1, A2, and/or A3), but the present disclosure is not limited thereto. In other embodiments, at least one pixel area may be defined by different signal transmission lines, for example, a data line and a common line, a scanning line and a common line, or a data line and/or a scanning line and other signal transmission lines. However, a pixel electrode generally exists in at least one pixel area. Therefore, the definition can be simplified as: an area of a vertical projection of at least one pixel on the first substrate 102 is at least one pixel area. The pixel areas A1, A2, and A3, for example, respectively correspond to the thin film transistors 108, 108', and 108". The thin film transistor 108 is only used as an example for detailed description below, and the example of the thin film transistor 108 may be referred to for examples of the thin film transistors 108' and 108" by such analogy. The thin film transistor 108 is disposed on the first insulation layer 110, and is electrically connected to the scanning line 104 and the data line 106A. The thin film transistor 108 comprises a semiconductor layer SE1, a gate electrode G1, a source electrode S1, and a drain electrode D1, and may be electrically connected to the scanning line 104 and the data line 106A via the gate electrode G1 and the source electrode S1. In some implementation manners, the first insulation layer 110 may be used a gate insulation layer. The second insulation layer 112 is disposed on the first insulation layer 110 and covers the data line 106A and the thin film transistor 108.

The wavelength conversion layer 114 of this embodiment is disposed on the second insulation layer 112, and is configured to receive a light beam from the outer surface S20 of the first substrate 102 (for example, light beams L1A, L1B, and/or L1C that pass through the pixel areas A1, A2, and/or A3). In another embodiment, the wavelength conversion layer 114 further comprises a first conversion part 116, a second conversion part 118, and a light transmission part 120 that can be respectively disposed in the pixel areas A1, A2, and A3. The first conversion part 116, the light transmission part 120, and the second conversion part 118 may be sequentially disposed on the second insulation layer 112 along an extension direction of the scanning line 104, and adjacent two of the first conversion part 116, the light transmission part 120, and the second conversion part 118 preferably abut against (or directly contact) each other, but the present disclosure is not limited thereto. In other embodiments, adjacent two of the first conversion part 116, the light transmission part 120, and the second conversion part 118 may be separated from each other or partially overlapping with each other. In addition, a top area outside projection of the data lines 106B and 106C, the top area of the first conversion part 116, the second conversion part 118, and the light transmission part 120 respectively have thicknesses T1, T2, and T3; T1 is substantively equal to T2, and T2 is substantively equal to T3, so that the wavelength conversion layer 114 may form a relatively flat upper surface, thereby facilitating forming a subsequent structure. In addition, although in the wavelength conversion layer 114 drawn in FIG. 1A, the first conversion part 116, the light transmission part 120, and the second conversion part 118 are sequentially arranged from left to right, a sequence of the first conversion part 116, the light transmission part 120, and the second conversion part 118 may be changed. For example, in other embodiments, in the wavelength conversion layer 114, the first conversion part 116, the second conversion part 118, and the light transmission part 120 may be sequentially arranged from left to right, and the first conversion part 116 is adjacent to and abuts against the second conversion part 118, and adjacent two of them may be separated from each other or partially overlapping with each other.

The first conversion part 116, the second conversion part 118, and the light transmission part 120 are respectively configured to receive the light beams L1A, L1B, and L1C; the first conversion part 116 and the second conversion part 118 respectively convert wavelengths of the light beams L1A and L1B into a first wavelength and a second wavelength; for example, the first wavelength is about 500 nm to 570 nm, and the second wavelength is about 620 nm to 750 nm, and the light transmission part 120, preferably, may be a transparent photoresist that can be penetrated by the light beam L1C, that is, a wavelength that passes through the light transmission part 120 is about a wavelength of the light beam L1C. For example, the light beams L1A, L1B, and L1C may be provided by a light source in a backlight module (not drawn), for example, a light source of a direct backlight module (not drawn) under the first substrate 102 may be set to provide the light beams, but the present disclosure is not limited thereto. In other embodiments, the backlight module (not drawn) may be an edge-type backlight module, and a light source in the backlight module may be disposed on a side edge of the first substrate 102, and the first substrate 102 may be used as a light guide plate (such as a plate that guides light); then the inner surface S10 of the first substrate 102 is a light emission surface; or the backlight module (not drawn) may be an edge-type backlight module, and a light source in the backlight module may be disposed on a side edge of a light guide plate (such as a plate that guides light, not drawn) in the backlight module, and then a light emission surface of the light guide plate faces the outer surface S20 of the first substrate 102. Wavelengths of the foregoing light beams L1A, L1B, and L1C, preferably, may be within a range of blue light (approximately from 440 nm to 475 nm) or ultraviolet light, so as to avoid additionally disposing another conversion part for providing blue light, thereby reducing manufacturing costs and manufacturing steps. However, in other embodiments, the backlight module may not be disposed, and a self-luminous layer (not shown) is disposed between the first substrate 102 and the wavelength conversion layer 114; for example, the self-luminous layer may be an organic light emitting diode (OLED), an inorganic light emitting diode, or an organic-inorganic mixed light emitting diode. The organic light emitting diode (OLED) may comprise an electron hole injection layer, an electron transmission layer, an organic light emitting layer, an electron transmission layer, an electron injection layer, or another suitable laminated layer; however, the inorganic light emitting diode (such as micro-LED) comprises a N-type semiconductor layer and a P-type semiconductor layer, or an N-type semiconductor layer, a P-type semiconductor layer, and an intrinsic semiconductor layer I sandwiched between the N-type semiconductor layer and the P-type semiconductor layer, or another suitable laminated layer.

The first conversion part 116 and the second conversion part 118 may respectively have a first quantum dot (or namely quantum rod) 120 and a second quantum dot 124. For example, the quantum dot is a semiconductor particle with a diameter of about 2 to 12 nm. According to a size of the quantum dot particle, it emits light with different wavelengths. For example, when blue light or ultraviolet light is illuminated, the quantum dots emit any one of red light, green light, and blue light according to sizes of the quantum dots. The first quantum dot 120 and the second quantum dot 124 may emit any one of the red light, green light, and blue light.

The first quantum dot 122 may be excited by the backlight module or the light beam L1A whose self-luminous band (or namely wavelength) is located in blue light, and emit a light beam L2 whose band falls into red light. The second quantum dot 124 may be excited by the light beam L1B whose band is located in blue light, and emit a light beam L3 whose band falls into green light. By using the first conversion part 116 and the second conversion part 118, the wavelength conversion layer 114 may convert the light beams L1A and L1B, which are emitted by the backlight module or self-luminous into corresponding light wavelength bands, and the light transmission part 120 makes the light beam L1C substantively maintain an original wavelength, so that the pixel areas A1, A2, and A3 of the pixel structure may respectively provide red, blue, and green. That is, by using the wavelength conversion layer 114, the pixel structure 100A may provide a plurality of colors (at least three different colors) by converting a single original color in a case of receiving the single original color, that is, according to the foregoing description, the first conversion part 116, the second conversion part 118, and the light transmission part 120 respectively corresponding to the pixel areas A1, A2, and A3 may display three different colors.

For example, the flat layer 126 is disposed on the wavelength conversion layer 114, and the metal grating polarizer layer (or namely metal grid polarizer layer) 128 is disposed on the flat layer 126. In other embodiments, flatness and/or roughness of the wavelength conversion layer 114 is still suitable for the metal grating polarizer layer 128 to be formed thereon, and the flat layer 126 may be selectively not disposed between the metal grating polarizer layer 128 and the wavelength conversion layer 114. The flat layer 126 may be a single-layer or multi-layer structure, and a material thereof may be an organic material or an inorganic material, for example, silicon oxide, silicon nitride, silicon oxynitride, epoxy resin, acryl, polyimide, another suitable material, or a combination of at least two of the foregoing materials, and preferably is a transparent organic material or a transparent inorganic material, and preferably the material of the flat layer 126 and a material of the light transmission part 120 may be a same layer of material, but the present disclosure is not limited thereto. In other embodiments, the material of the flat layer 126 may be different from the material of the light transmission part 120. The metal grating polarizer layer 128 has a polarization characteristic (or namely polarization function), that is, the metal grating polarizer layer 128 may make a light beam corresponding to a polarized state to pass through the metal grating polarizer layer 128, and a light beam corresponding to a non-polarized state is reflected from the metal grating polarizer layer 128. The third insulation layer 130 is disposed on the metal grating polarizer layer 128, and the pixel electrodes 132A, 132B, and 132C are disposed on the third insulation layer 130. The pixel electrodes 132A, 132B, and 132C are respectively located in the pixel areas A1, A2, and A3 and are connected to drain electrodes D1, D2, and D3 of the thin film transistors 108, 108', and 108" corresponding thereto via a through hole of the third insulation layer 130. In other words, the pixel electrodes 132A, 132B, and 132C corresponding to the pixel areas A1, A2, and A3 are separated from the metal grating polarizer layer 128, to prevent the pixel electrodes 132A, 132B, and 132C in the pixel structure 100A from electrically affecting each other. In other embodiments, the metal grating polarizer layer 128 may also be used as a common electrode on the first substrate.

However, in another varied embodiment, the metal grating polarizer layer 128 is used as the pixel electrodes 132A, 132B, and 132C. In other words, the metal grating polarizer layer 128 and the pixel electrodes 132A, 132B, and 132C are formed by a same film layer, that is, there is no third insulation layer 130 in FIG. 1B. The metal grating polarizer layer 128 in this varied embodiment has a plurality of blocks (not marked) separated from each other, which is located in the pixel areas A1, A2, and A3 of the pixel structure 100A, and each of the separated blocks is electrically connected to at least one of the thin film transistors 108, 108', and 108" corresponding to the pixel areas A1, A2, and A3. A top view of the separated blocks (not marked) that are respectively located in the pixel areas A1, A2, and A3 is similar to that of the pixel electrodes 132A, 132B, and 132C included in the pixel areas A1, A2, and A3 of FIG. 1A, and details are not described herein again. In still another varied embodiment, the pixel areas A1, A2, and A3 include the corresponding pixel electrodes 132A, 132B, and 132C, and the metal grating polarizer layer 128 of the corresponding plurality of blocks separated from each other (not marked); the third insulation layer 130 is still sandwiched between the pixel areas 132A, 132B, and 132C and the metal grating polarizer layer 128; and the pixel electrodes 132A, 132B, and 132C corresponding to the pixel areas A1, A2, and A3 may be selectively connected or not connected to the metal grating polarizer layer 128 of the corresponding plurality of blocks separated from each other (not marked). For example, when the pixel electrode 132A of the pixel area A1 is connected to a corresponding block, the corresponding block may also be used along with the pixel electrode 132A as pixel electrodes of the pixel area A1, that is, there are two separated but connected two layers of pixel electrodes, and relationships in remaining pixel areas can be obtained by such arrangement; when the pixel electrode 132A of the pixel area A1 is not connected to the metal grating polarizer layer 128 of the corresponding block, the metal grating polarizer layer 128 of the corresponding block may also be used as a common electrode on the first substrate, and relationships in remaining pixel areas can be obtained by such analogy. In other words, each block may correspond to at least one of the thin film transistors. In this case, two adjacent blocks may be selectively connected or not connected to each other. A top view of the separated blocks (not marked) that are respectively located in the pixel areas A1, A2, and A3 is similar to that of the pixel electrodes 132A, 132B, and 132C included in the pixel areas A1, A2, and A3 of FIG. 1A, and details are not described herein again.

In this embodiment of the present disclosure, the wavelength conversion layer 114 is preferably located between the first substrate 102 and the pixel electrodes 132A, 132B, and 132C. The metal grating polarizer layer 128 is disposed between the wavelength conversion layer 114 and the pixel electrodes 132A, 132B, and 132C. In other words, the metal grating polarizer layer 128 is preferably disposed between a display medium layer (not drawn) and the wavelength conversion layer 114, wherein the display medium layer, for example, is a liquid crystal layer. However, light (or wavelength) obtained by conversion by the wavelength conversion layer 114 does not have a polarization characteristic (that is, the light (or wavelength) obtained by conversion irradiates towards a plurality of directions, or called depolarization). However, upon the foregoing configuration of this embodiment, depolarization of the wavelength conversion layer 114 can be effectively improved; in other words, the metal grating polarizer layer 128 is disposed between the wavelength conversion layer 114 and the pixel electrodes 132A, 132B, and 132C, and light beams L1A', L1B', and L1C' can keep corresponding polarized states when entering the display medium layer (not shown), so that light has great light transmittance when passing through the display medium layer, thereby increasing light transmittance of a displayed image. When an external light beam is reflected on the metal grating polarizer layer 128 or an internal light beam of the pixel structure 100A is reflected, for example, the light beams may be reflected from the data lines 106A, 106B, and 106C to the metal grating polarizer layer 128, and can keep corresponding polarized states when entering the display medium layer again, and therefore, light emission efficiency of the pixel structure 100A can be increased. On the contrary, if the metal grating polarizer layer 128 is disposed between the wavelength conversion layer 114 and the first substrate 102, light transmittance may be decreased and/or light emission efficiency gets worse.

Figure 2:
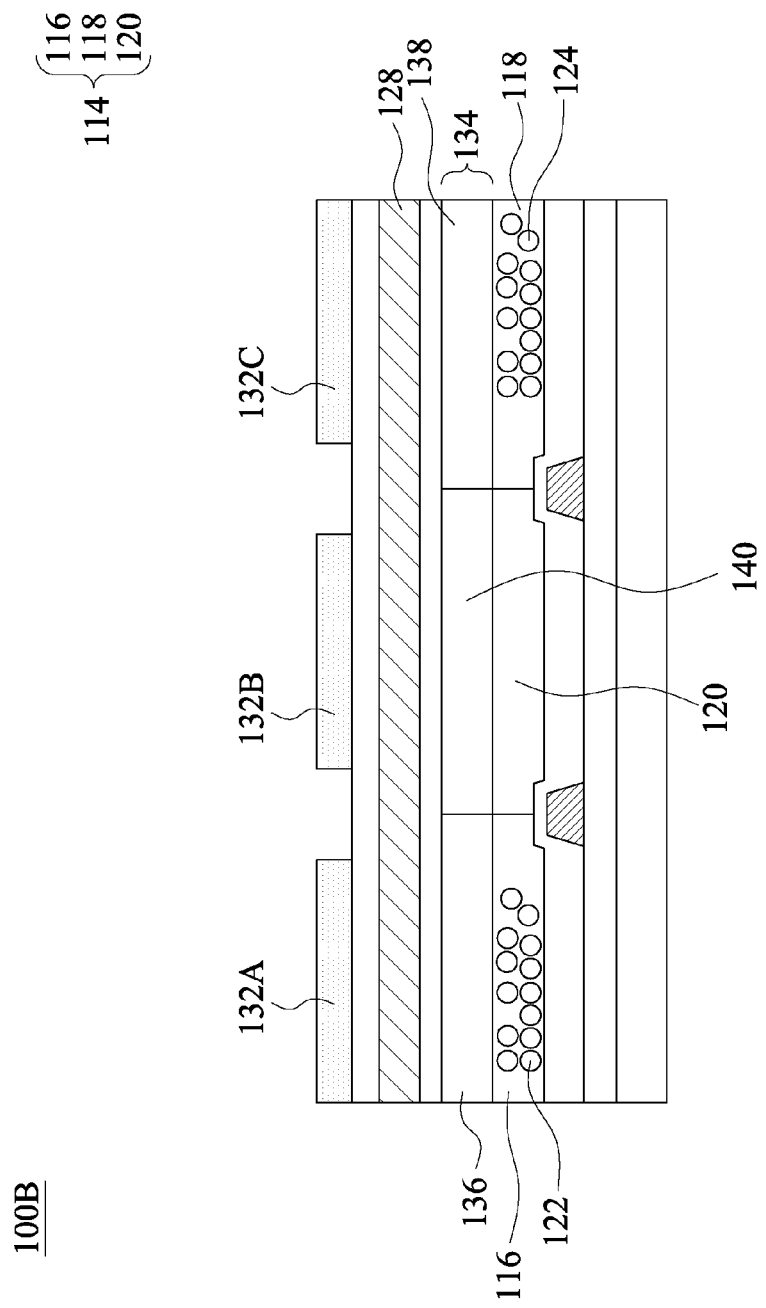
FIG. 2 is a schematic sectional view of a pixel structure according to a second embodiment of the present disclosure, wherein a sectional location of FIG. 2 is the same as that of FIG. 1B.

Referring to FIG. 2, FIG. 2 is a schematic sectional view of a pixel structure 100B according to a second embodiment of the present disclosure, wherein a sectional location of FIG. 2 is the same as that of FIG. 1B. At least one difference between the present embodiment and the first embodiment lies in that, the pixel structure 100B of the present embodiment further comprises a color filter layer 134, which is disposed between a wavelength conversion layer 114 and a metal grating polarizer layer 128, and comprises a first filter part 136, a second filter part 138, and a third filter part 140. The first filter part 136 is disposed on a vertical projection of a first conversion part 116; the second filter part 138 is disposed on a vertical projection of a second conversion part 118; and the third filter part 140 is disposed on a vertical projection of a light transmission part 120.

In a combination of the first filter part 136 and the first conversion part 116, a first quantum dot 122 in the first conversion part 116 may emit a light beam with a first wavelength by means of excitation, and the first filter part 136 may make the light beam with the first wavelength to pass through the first filter part 136. By means of the combination, a color mixing phenomenon among the first conversion part 116 the second conversion part 118, and the light transmission 120 can be avoided, so as to improve color purity of corresponding wavelengths. Similarly, the second filter part 138 and the third filter part 140 respectively can make light beams having corresponding wavelengths to pass through the second filter part 138 and the third filter part 140, and therefore can improve color purity of corresponding wavelengths. By means of the configured, improving color purity of the pixel structure 100B can also improve a color gamut range of the pixel structure 100B, so as to improve color rendering capabilities of the pixel structure 100B.

Figure 3:
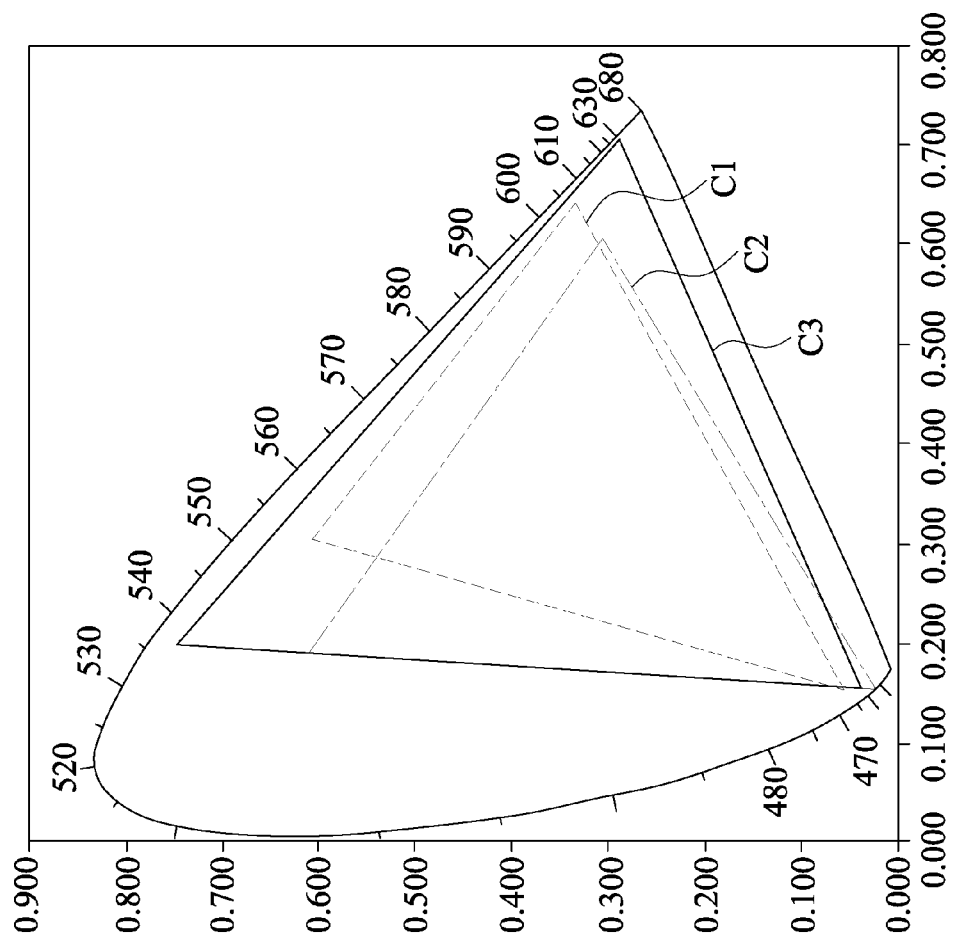
FIG. 3 is a color space diagram of a pixel structure of a comparative example, a pixel structure of a first embodiment, and a pixel structure of a second embodiment.

Specifically, as shown in FIG. 3, FIG. 3 is a color space diagram of a pixel structure of a comparative example, the pixel structure 100A of the first embodiment, and the pixel structure 100B of the second embodiment, wherein the pixel structure of the comparative example is similar to the pixel structure shown in FIG. 1B, but a wavelength conversion layer 114 and a metal grating polarizer layer 128 are not disposed in the pixel structure of the comparative example. In FIG. 3, the horizontal axis is an X coordinate axis of a CIE 1931 color space, and the vertical axis is the Y coordinate axis of the CIE 1931 color space; curves C1, C2, and C3 respectively indicate colors spaces of the pixel structure of the comparative example, the pixel structure 100A of the first embodiment, and the pixel structure 100B of the second embodiment, wherein neither of the X and Y coordinate axes has a unit.

Coordinates of red, green, and blue vertexes of the curve C1 are respectively fall at (0.644, 0.333), (0.304, 0.606), and (0.154, 0.056); coordinates of red, green, and blue vertexes of the curve C2 are respectively fall at (0.605, 0.307), (0.192, 0.610), and (0.155, 0.021); and coordinates of red, green, and blue vertexes of the curve C3 are respectively fall at (0.709, 0.290), (0.198, 0.748), and (0.155, 0.037). A color gamut range covered by the curve C3 is greater than that covered by the curve C2, and the color gamut range covered by the curve C2 is also greater than that covered by the curve C1. Based on the above, the pixel structures of the first embodiment and the second embodiment can reach color gamut ranges broader than that of the comparative example.

Figure 4A:
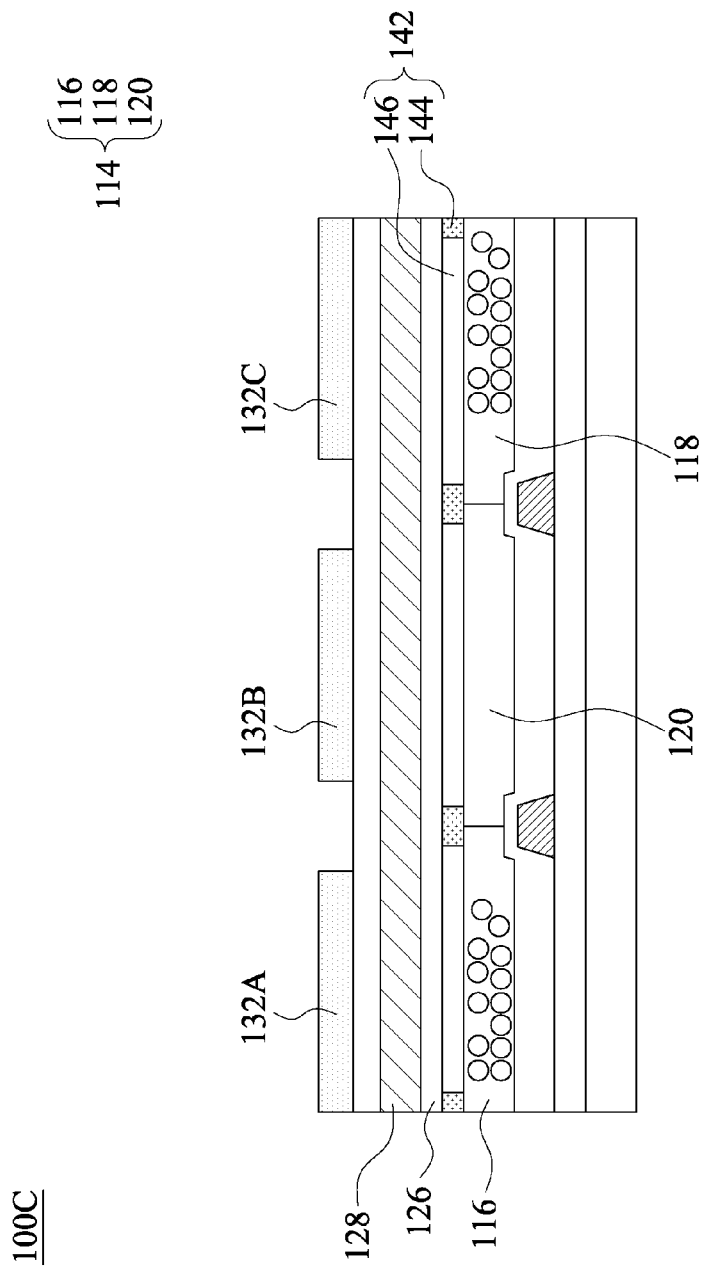
FIG. 4A is a schematic sectional view of a pixel structure according to a third embodiment of the present disclosure, wherein a sectional location of FIG. 2 is the same as that of FIG. 1B.

Referring to FIG. 4A, FIG. 4A is a schematic sectional view of a pixel structure 100C according to a third embodiment of the present disclosure, wherein a sectional location of FIG. 2 is the same as that of FIG. 1B. At least one difference between the present embodiment and the first embodiment lies in that, the pixel structure 100C further comprises a light collimating layer 142, which is disposed between a wavelength conversion layer 114 and pixel electrodes 132A, 132B, and 132C, and can be configured to improve light emission collimation of the pixel structure 100C.

The light collimating layer 142 is disposed above the wavelength conversion layer 114 and is sandwiched between the wavelength conversion layer 114 and a flat layer 126, and preferably directly contacts the wavelength conversion layer 114. In other embodiments, if the flat layer 126 is not disposed this embodiment, then the light collimating layer 142 is disposed between the wavelength conversion layer 114 and a metal grating polarizer layer 128, and different surfaces of the light collimating layer 142 respectively contact the wavelength conversion layer 114 and the metal grating polarizer layer 128. The light collimating layer 142 comprises a reflection part 144 and a transmission part 146, wherein the transmission part 146 is disposed between two adjacent reflection parts 144, and preferably abuts against (such as directly contact) the reflection part 144. In other words, a vertical projection of the reflection part 144 on the wavelength conversion layer 114 is located on a boundary (or namely contacted side) between a first conversion part 116 and a light transmission part 120, or on a boundary (or namely contacted side) between a second conversion part 118 and the light transmission part 120. In addition, in other embodiments, when the first conversion part 116 and the second conversion part 118 of the wavelength conversion layer 114 are closely adjacent to each other, the vertical projection of the reflection part 144 on the wavelength conversion layer 114 is located on a boundary (or namely contacted side) between the first conversion part 116 and the second conversion part 118. In addition, in some embodiments, the transmission part 146 and the flat layer 126 may be formed by means of a same manufacture procedure. Or, in other embodiments, the transmission part 146 and the flat layer 126 may also be formed by means of different manufacture procedures.

Figure 4B:
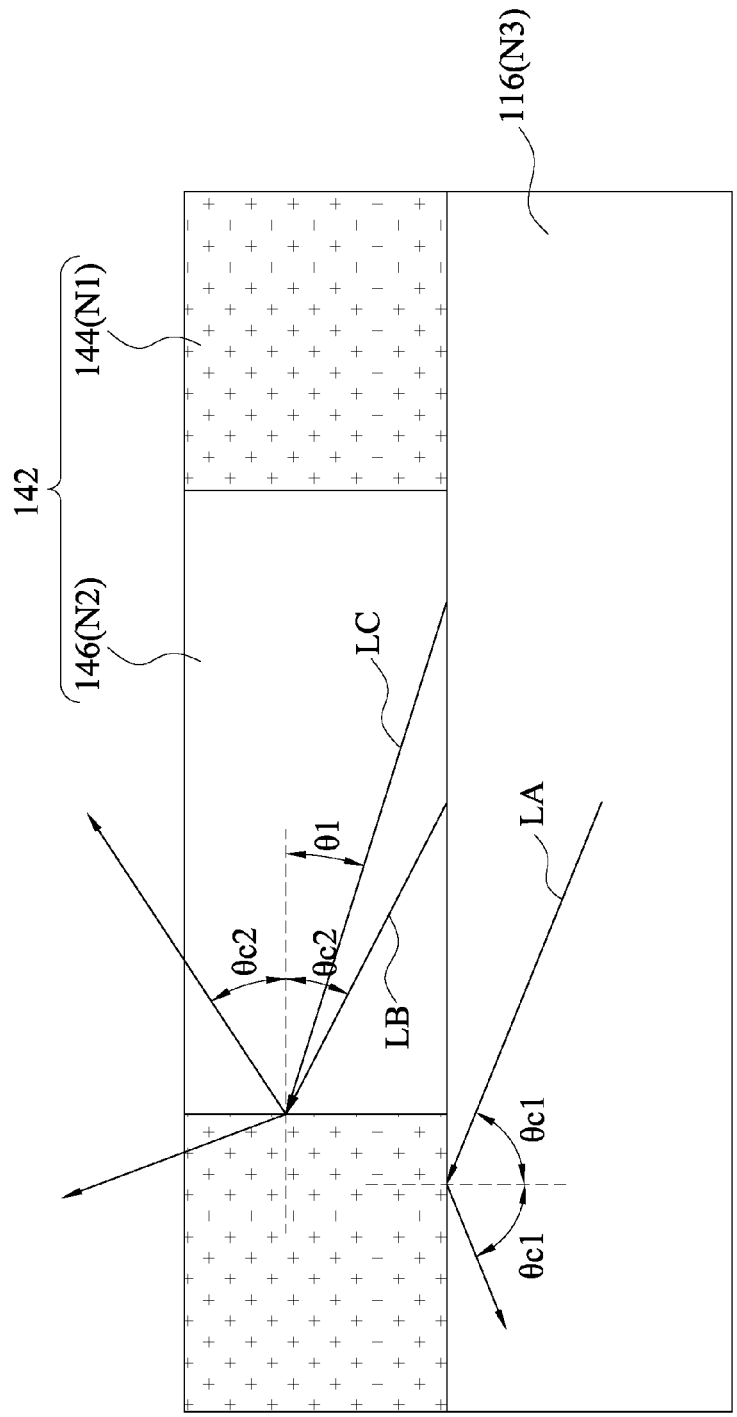
FIG. 4B is a schematic diagram of a light path emitted to a reflection part of FIG. 4A.

Referring to FIG. 4B, FIG. 4B is a schematic diagram of a path of light emitted to the reflection part 144 of FIG. 4A. In FIG. 4B, light emitted to the reflection part 144 may be divided into light LA, light LB, and light LC, wherein the light LA is emitted to a bottom surface of the reflection part 144 from the first conversion part 116 of the wavelength conversion layer 114 (referring to FIG. 4A), and the light LB and the light LC are emitted to a side edge of the reflection part 144 from the transmission part 146. In the present embodiment, the reflection part 144 and the transmission part 146 may be transparent materials; the reflection part 144 has a first refractive index N1; the transmission part 146 has a second refractive index N2; and the first conversion part 116 of the wavelength conversion layer 114 (referring to FIG. 4A) has a third refractive index N3, and N3≥N2>N1. In addition, a ratio of the first refractive index N1 to the third refractive index N3 may be between about 0.7 and 0.9, that is, 0.9≥(N1/N3)≥0.7.

Under such configuration, when the light LA reaches an interface between the first conversion part 116 and the reflection part 144, if an incident angle of the light LA on the reflection part 144 is greater than or approximately equal to a total reflection critical angle θc1 between the first conversion part 116 and the reflection part 144, the light LA generates total reflection. The total reflection critical angle θc1 is an included angle between a datum line (such as a vertical dotted line) orthogonal to a bottom surface of the reflection part 144 and the light LA. On the other aspect, when the light LB reaches an interface between the transmission part 146 and the reflection part 144, if an incident angle of the light LB on the reflection part 144 is greater than a total reflection critical angle θc2 between the transmission part 146 and the reflection part 144, the light LB is also reflected from the reflection part 144, and advances towards the pixel electrode 132A (referring to FIG. 4A) after reflection. The total reflection critical angle θc2 is an included angle between a datum line (such as a horizontal dotted line) orthogonal to the side edge of the reflection part 144 and the light LB. That is, when some of light beams in the pixel structure 100C deviate from an original light emission path, the light beams can be made to advance towards a bottom part of the pixel structure 100C or towards the pixel electrodes 132A, 132B, and 132C after reflection by means of total reflection that occurs on the reflection part 144, so as to prevent a case in which color mixing occurs to the pixel structure 100C.

Figure 4C:
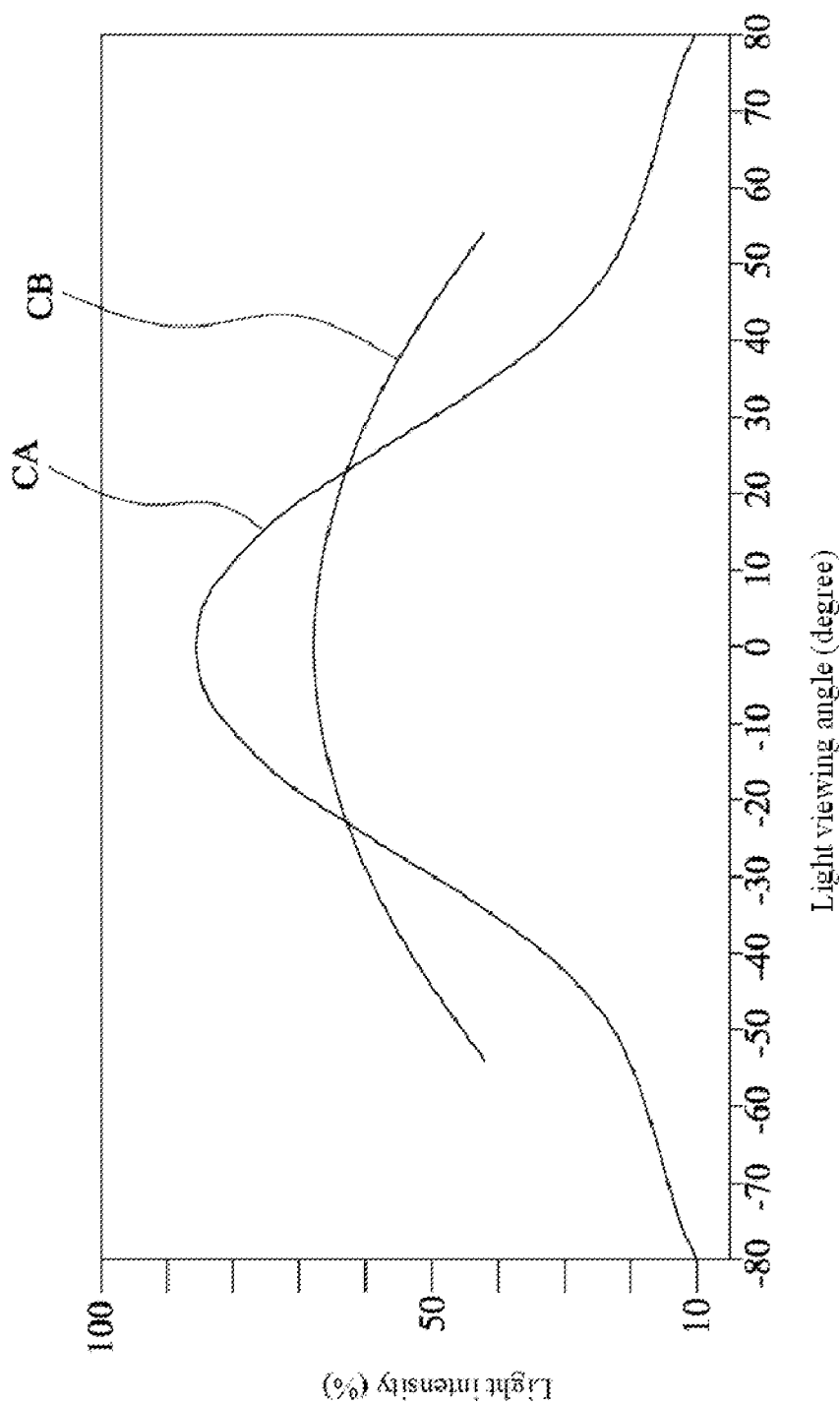
FIG. 4C is a diagram of a relationship between a light viewing angle and light intensity of a pixel structure of FIG. 4A.

In addition, because an incident angle θ1 of the light LC on the reflection part 144 is less than the total reflection critical angle θc2 between the transmission part 146 and the reflection part 144, the light LC enters the reflection part 144 after refraction, and the refracted light LC deviates from a normal of the interface between the transmission part 146 and the reflection part 144, so as to improve light collimation. The incident angle θ1 is an included angle between the datum line (such as a horizontal dotted line) orthogonal to the side edge of the reflection part 144 and the light LC. An improved light emission viewing angle may be shown in FIG. 4C, wherein FIG. 4C is a diagram of a relationship between a light emission viewing angle and light intensity of the pixel structure 100C of FIG. 4A. In FIG. 4C, the horizontal axis is the light emission viewing angle of the pixel structure, and a unit of the light emission viewing angle is degree; the vertical axis is the light emission intensity of the pixel structure, wherein the light emission intensity is normalized, and a unit of the light emission intensity is percent. A curve CA is a pixel structure in which no light collimating layer is disposed; a curve CB is a pixel structure provided with the light collimating layer, for example, a pixel structure as that in the third embodiment. According to FIG. 4C, it can be known that a light emission viewing angle of the pixel structure provided with the light collimating layer may be focused between about −60 degrees (negative 60°) to about +60 degrees (positive 60°), and has substantially uniform light emission intensity.

In addition, the reflection part 144 of the present embodiment is formed by using a transparent material. In another varied embodiment, the reflection part 144 may also be a nontransparent material, for example, a black matrix. However, in other embodiment s, the reflection part 144 may also use a material having light reflectivity, for example, metal. However, when the reflection part 144 is a nontransparent or reflective material, the refracted or reflected light in FIG. 4B does not enter the reflection part 144, and then leave a top surface of the reflection part 144.

Referring to FIG. 5, FIG. 5 is a schematic sectional view of a pixel structure 100D according to a fourth embodiment of the present disclosure, wherein a sectional location of FIG. 5 is the same as that of FIG. 1B. At least one difference between the present embodiment and the third embodiment lies in that, the pixel structure 100D of the present embodiment further comprises a color filter layer 134, which is disposed between a wavelength conversion layer 114 and a light collimating layer 142, and directly contacts the light collimating layer 142. The color filter layer 134 comprises a first filter part 136, a second filter part 138, and a third filter part 140. The first filter part 136 is disposed on a first conversion part 116; the second filter part 138 is disposed on a second conversion part 118; and the third filter part 140 is disposed on a light transmission part 120. In addition, an refractive index of the wavelength conversion layer 114 (for example, the first conversion part 116, the second conversion part 118, and the light transmission part 120) is substantively the same as that of the color filter layer 134 (for example, the first filter part 136, the second filter part 138, and the third filter part 140), that is, refractive indexes of the wavelength conversion layer 114 and the color filter layer 134 are both greater than those of the reflection part 144 and the transmission part 146 of the light collimating layer 142. In addition, the foregoing embodiments may be referred to for the relationship between the first conversion part 116 and the first filter part 136, the relationship between the second conversion part 118 and the second filter part 138, and the relationship between the light transmission part 120 and the third filter part 140, and details are not described herein again.

In the present embodiment, a combination between the wavelength conversion layer 114 and the color filter layer 134 can improve color rendering capabilities of the pixel structure 100D, and a combination between the color filter layer 134 and the light collimating layer 142 can prevent a case in which color mixing occurs to the pixel structure 100D, and improve a light viewing angle of the pixel structure 100D; a mechanism thereof may be similar to the foregoing embodiments, and details are not described herein again.

Various element combination manners of the foregoing embodiments may present different light emission efficiencies and color saturations. Specifically, referring to Table 1, Table 1 is a measurement result of light emission efficiencies and color saturations of the comparative example and different embodiments.

TABLE 1

Measurement Result of Light Emission Efficiencies and Color Saturations of Comparative Example and Different embodiments

|  | Light emission efficiency | Color saturation (NTSC) |
| --- | --- | --- |
| Comparative example | X | 72% |
| First embodiment | 1.3X | 80% |
| Third embodiment | 2.2X | 80% |
| Fourth embodiment | 1.98X | 120% |

In Table 1, the comparative example is a pixel structure in which the wavelength conversion layer, the metal grating polarizer layer, and the light collimating layer are not disposed, that is, the pixel structure of the comparative example is similar to the pixel structure shown in FIG. 1B, but the pixel structure of the comparative example is not provided with the wavelength conversion layer and the metal grating polarizer layer. However, as stated above, the pixel structure of the first embodiment comprises the wavelength conversion layer and the metal grating polarizer layer; the pixel structure of the third embodiment comprises the wavelength conversion layer, the metal grating polarizer layer and the light collimating layer; and the pixel structure of the fourth embodiment comprises the wavelength conversion layer, the color filter layer, the metal grating polarizer layer, and the light collimating layer. In the measurement result, the light emission efficiency of the comparative example is represented by X, and the light emission efficiencies of the first, third, and fourth embodiments are respectively about 1.3X, about 2.2X, and about 1.98X, that is, respectively about 1.3 times, about 2.2 times, and about 1.98 times of the light emission efficiency of the comparative example. The color saturations of the comparative example, and the first, third, and fourth embodiments are respectively about 72%, about 80%, about 80%, and about 120% under the NTSC specification. According to table 1, it can be known that various element combination manners of the foregoing embodiments can improve the light emission efficiencies and color saturations of the pixel structures.

Figure 6:
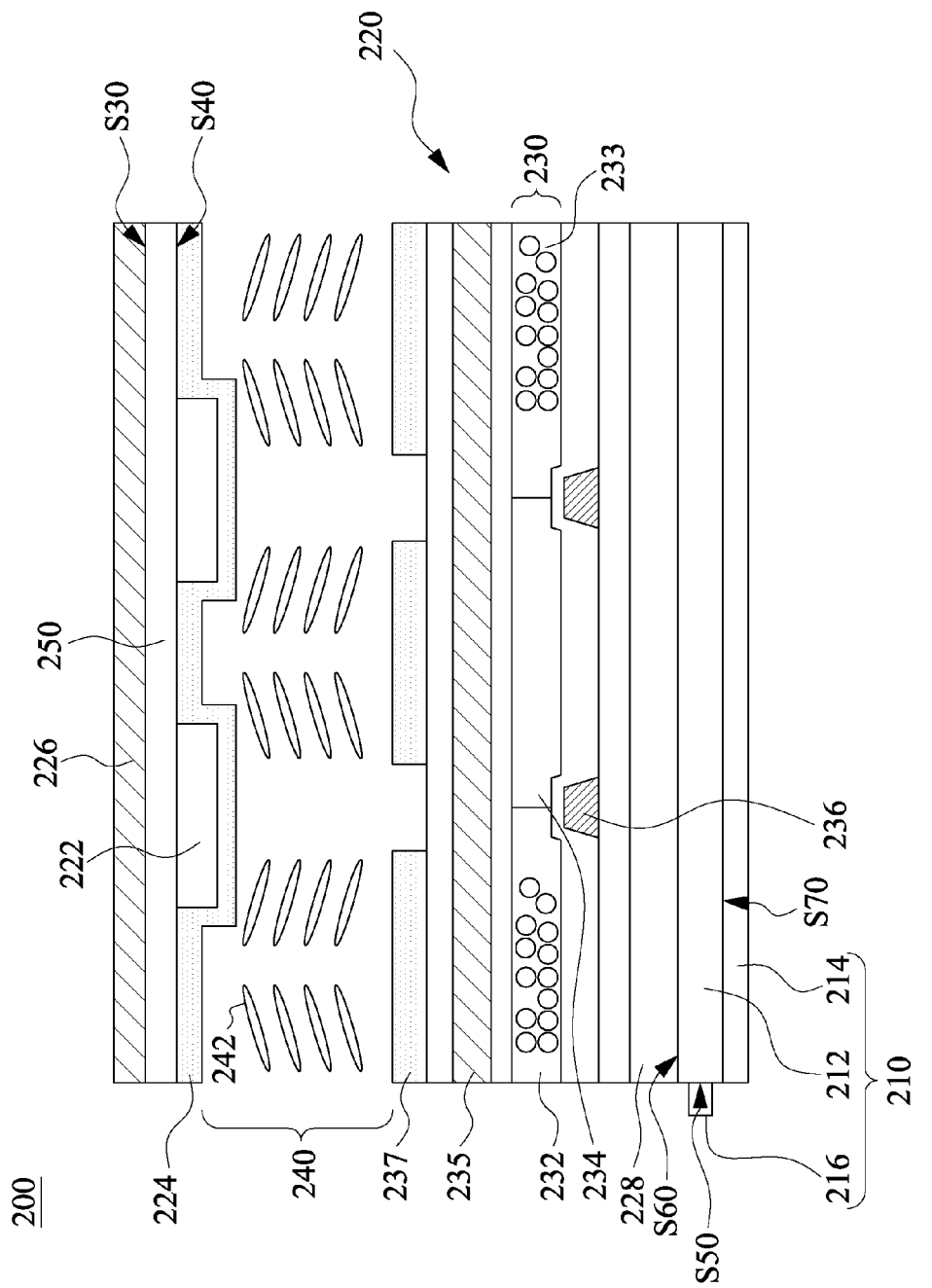
FIG. 6 is a schematic sectional view of a display panel according to a fifth embodiment of the present disclosure, wherein a sectional location of FIG. 6 is the same as that of FIG. 1B.

In addition, all of the pixel structures of the foregoing various embodiments can be applied to form display panels, for example, a second substrate may be further disposed, and a display medium is filled between the first substrate and the second substrate, so as to complete assembly of a display panel. The display panel may not comprise a backlight module, and uses a self-luminous display medium layer. Another embodiment is shown in FIG. 6. FIG. 6 is a schematic sectional view of a display panel 200 according to a fifth embodiment of the present disclosure, wherein a sectional location of FIG. 6 is the same as that of FIG. 1B. The display panel 200 of the present embodiment may be considered as application of the pixel structure 100A of the first embodiment. The display panel 200 comprises a backlight module 210, a pixel structure 220, a display medium layer 240, and a second substrate 250. The pixel structure 220 of the present embodiment may be configured in a way similar to that of the pixel structure 100A of the first embodiment. However, the pixel structure 220 of the present embodiment further comprises another metal grating polarizer layer (or namely another metal grid polarizer layer) 226. That is, the pixel structure 220 comprises two metal grating polarizer layers (or namely two metal grid polarizer layers). In other embodiments, the pixel structure 220 may further comprise at least one of a light shield layer 222 and a common electrode 224 on the second substrate 250.

The second substrate 250 is disposed opposite to the first substrate 228 of the pixel structure 220, and the second substrate 250 has an upper surface S30 and a lower surface S40; the upper surface S30 and the lower surface S40 of the second substrate 250 is back to and faces the first substrate 228 of the pixel structure 220 respectively. The display medium layer 240 is disposed between the first substrate 228 and the second substrate 250. The display medium layer 240 has a plurality of display media 242, which, for example, may be liquid crystal molecules.

For example, the pixel structure 220 of the present disclosure comprises the light shield layer 222 and the common electrode 224; then the light shield layer 222 and the common electrode 224 are disposed on the lower surface S40 of the second substrate 250; and the common electrode 224 covers the light shield layer 222. The light shield layer 222, for example, may be a black matrix (BM). A vertical projection of the light shield layer 222 on the wavelength conversion layer 230 of the pixel structure 220 locates at least on an interface surface (or namely boundary) between a first conversion part 232 and a light transmission part 234 or an interface surface (or namely boundary) between a second conversion part 233 and the light transmission part 234; that is, a vertical projection of the light shield layer 222 on the wavelength conversion layer 230 is located at an abutting place (or namely contact place) between the first conversion part 232 and the light transmission part 234, or at an abutting place (or namely contact place) between the second conversion part 233 and the light transmission part 234. In addition, in other embodiments, when the first conversion part 232 and the second conversion part 233 of the wavelength conversion layer 230 are adjacent to and abut against (or namely contact with) each other, a vertical projection of the light shield layer 222 on the wavelength conversion layer 230 is located at a boundary (or interface surface) between the first conversion part 232 and the second conversion part 233, namely, located at an abutting place (or namely contact place). In addition, although the light shield layer 222 in FIG. 6 is disposed on the lower surface S40 of the second substrate 250, in other embodiments, the light shield layer 222 may also be disposed on the first substrate 228. On the other aspect, in addition to the light shield layer 222, because a vertical projection of a data line 236 on the wavelength conversion layer 230 also falls on the interface surface (or namely boundary) between the first conversion part 232 and the light transmission part 234, or on the interface surface (or namely boundary) between the second conversion part 233 and the light transmission part 234, the data line 236 may also be used to perform a light shield function.

The metal grating polarizer layer 226 is disposed on the upper surface S30 of the second substrate 250, but the present disclosure is not limited thereto. In other embodiments, the metal grating polarizer layer 226 may also be selectively disposed on the lower surface S40 of the second substrate 250. In the pixel structure 220, a combination of a metal grating polarizer layer 235, a pixel electrode 237, the display medium layer 240, the common electrode 224, and the metal grating polarizer layer 226 can define a display state of the display panel 200. More specifically, the display state of the display panel 200 may be defined by means of potential driving states of the pixel electrode 237 and the common electrode 224 of the pixel structure 220.

The backlight module 210 can be stated in the foregoing embodiments, for example, an edge-type or direct backlight module. In the present embodiment of the disclosure, take the edge-type backlight module 210 for example. The edge-type backlight module 210, for example, may comprise a light guide plate 212, a reflection layer 214, and a light source 216. The light guide plate 212 has a side surface S50 and opposite upper surface S60 and lower surface S70, and the backlight module 210 is connected to the first substrate 228 of the pixel structure 220 via the upper surface S60 of the light guide plate 212. The light source 216 is disposed on the side surface S50 of the light guide plate 212, and emits light beams into the light guide plate 212, and the reflection layer 214 is disposed on the lower surface S70 of the light guide plate 212. In one embodiment of the disclosure, the light source 216 may be implemented by LED in order to illuminate blue light or ultraviolet light.

For example, at least one of the thin film transistors 108, 108' and 108" of the foregoing embodiments of the present disclosure is a bottom gate transistor, for example, the semiconductor layer SE1 of the thin film transistor 108 is located on the gate electrode G1, and cases of the remaining thin film transistors 108' and 108" can be obtained and so on, but the present disclosure is not limited thereto. In other embodiments, at least one of the thin film transistors 108, 108' and 108" is a top gate transistor, for example, the semiconductor layer SE1 of the thin film transistor 108 is located below the gate electrode G1, and cases of the remaining thin film transistors 108' and 108" can be obtained and so on, or the thin film transistors 108' and 108" are transistors of other suitable types. A semiconductor layer (for example, the semiconductor SE1, SE2, or SE3) may be a single-layer or multi-layer structure, and materials thereof include amorphous silicon, nano crystalline silicon, microcrystalline silicon, polycrystalline silicon, monocrystalline silicon, carbon nanotube (rod), oxide semiconductor materials, organic semiconductor materials, or other suitable materials. In the foregoing embodiments of the present disclosure, a location where a pixel electrode (for example, at least one of the pixel electrodes 132A, 132B, and 132C) is connected to a drain of a thin film transistor corresponding thereto (for example, at least one of the drain electrode D1 of the thin film transistor 108, the drain electrode D2 of the thin film transistor 108', or the drain electrode D3 of the thin film transistor 108") is within a location where the pixel electrode (for example, at least one of the pixel electrodes 132A, 132B, and 132C) is located, but the present disclosure is not limited thereto. In other embodiments, a location where a pixel electrode (for example, at least one of the pixel electrodes 132A, 132B, and 132C) is connected to a drain electrode of a thin film transistor corresponding thereto (for example, at least one of the drain electrode D1 of the thin film transistor 108, the drain electrode D2 of the thin film transistor 108', or the drain electrode D3 of the thin film transistor 108") is on the scanning line 104 or another suitable location. A projection shape of at least one of the pixel areas A1 to A3 of the foregoing embodiments of the present disclosure may be a polygon, for example, a triangle, a quadrangle, a pentagon, a pentagon, a circle, or another suitable projection shape. For example, at least one of the pixel areas A1 to A3 of the foregoing embodiments of the present disclosure is vertically disposed, but the present disclosure is not limited thereto. In other embodiments, at least one of the pixel areas A1 to A3 may also be horizontally disposed. For example, the metal grating polarizer layers 128, 226 and/or 235 of the embodiments of the present disclosure may be wire grid polarizers (that is, a plurality of metal wires substantively parallel to each other filter light; light with a linear polarization direction consistent with a metal wire arrangement direction can pass through, and otherwise, is reflected and/or refracted), but the present disclosure is not limited thereto. In other embodiments, the metal grating polarizer layers 128, 226 and/or 235 may be round polarizers, for example, spiral metal wire grids, but the present disclosure is not limited thereto. There is a gap between any two adjacent metal wires to separate the two adjacent metal wires; widths of the metal wires may be on a micron level or a nano level; the metal grating polarizer layers 128, 226 and/or 235 may be single-layer or multi-layer structures, and materials thereof include metal, metal alloys, oxides of the foregoing materials, nitrides of the foregoing materials, oxynitrides of the foregoing materials, or other suitable materials. In other embodiments, material of the metal grating polarizer layers 128, 226 and/or 235 may be light shield materials (for example, black photoresists), conductive adhesives, organic conductive materials, or other materials (for example, organic or inorganic materials).

The pixel structure of the present disclosure comprises the wavelength conversion layer and the metal grating polarizer layer, which may also be selectively configured along with other elements (for example, at least one of the color filter layer and the light collimating layer). The metal grating polarizer layer can make light beams that cannot penetrate the metal grating polarizer layer reflected on the metal grating polarizer layer, so as to increase an opportunity that light beams penetrate through the metal grating polarizer layer again, thereby increasing light emission efficiency of the pixel structure. For example, if the wavelength conversion layer directly contacts the color filter layer, a combination thereof can improve color purity of the pixel structure as well as a color gamut range of the pixel structure, thereby improving color rendering capabilities of the pixel structure. The light collimating layer can improve a light viewing angle of the pixel structure, so that the light viewing angle can be focused within a particular range, and has uniform light emission intensity. The aforementioned plurality of combination manners of the elements can make the pixel structure present different light emission efficiencies and color saturations. In addition, all of pixel structures having different combination manners can be applied to form a display panel.

The present disclosure is disclosed through the foregoing plurality of embodiments; however, these embodiments are not intended to limit the present disclosure. Various changes and modifications made by persons of ordinary skill in the art without departing from the spirit and scope of the present disclosure shall fall within the protection scope of the present disclosure. The protection scope of the present disclosure is subject to the appended claims.

What is claimed is:

1. A pixel structure, comprising:
   a first substrate;
   a plurality of thin film transistors, disposed on an inner surface of the first substrate;
   a metal grating polarizer layer, disposed on the thin film transistors;
   a wavelength conversion layer, disposed between the inner surface of first substrate and the metal grating polarizer layer, comprising:
      a first conversion part, for receiving a light beam and converts the light beam into a first wavelength; and
      a second conversion part, for receiving the light beam and converts the light beam into a second wavelength;
      wherein the wavelength conversion layer receives the light beam between the wavelength conversion layer and the first substrate; and
   a light collimating layer, disposed between a pixel electrode and the wavelength conversion layer, wherein the light collimating layer further comprises a reflection part and a transmission part, wherein a vertical projection of the reflection part on the wavelength conversion layer is located between the first conversion part and the second conversion part.

2. The pixel structure according to claim 1, further comprising a flat layer, disposed between the wavelength conversion layer and the metal grating polarizer layer.

3. The pixel structure according to claim 1, further comprising a color filter layer, disposed between the wavelength conversion layer and the metal grating polarizer layer.

4. The pixel structure according to claim 3, wherein the wavelength conversion layer further comprises:
   a first conversion part, for receiving the light beam, and converting the light beam into a first wavelength; and
   a second conversion part, for receiving the light beam, and converting the light beam into a second wavelength.

5. The pixel structure according to claim 4, wherein the color filter layer further comprises:
   a first filter part, disposed on the first conversion part; and
   a second filter part, disposed on the second conversion part.

6. The pixel structure according to claim 1, wherein the reflection part has a first refractive index, the transmission part has a second refractive index, and the second refractive index is greater than the first refractive index.

7. The pixel structure according to claim 6, wherein the wavelength conversion layer directly contacts the light collimating layer, the wavelength conversion layer has a third refractive index, and the third refractive index is greater than or equal to the second refractive index.

8. The pixel structure according to claim 7, wherein a ratio of the first refractive index to the third refractive index is between 0.7 and 0.9.

9. The pixel structure according to claim 6, further comprising:
   a color filter layer, disposed between the wavelength conversion layer and the light collimating layer, wherein the color filter layer directly contacts the light collimating layer, the color filter layer has a third refractive index, and the third refractive index is greater than the second refractive index.

10. The pixel structure according to claim 9, wherein a ratio of the first refractive index to the third refractive index is between 0.7 and 0.9.

11. The pixel structure according to claim 1, further comprising a plurality of pixel electrodes, disposed on the inner surface of the first substrate, wherein each pixel electrode is respectively electrically connected to a corresponding thin film transistor, and the metal grating polarizer layer is disposed between the wavelength conversion layer and the pixel electrodes.

12. The pixel structure according to claim 11, wherein the metal grating polarizer layer is used as a common electrode on the first substrate.

13. The pixel structure according to claim 12, wherein the metal grating polarizer layer comprises a plurality of blocks separated from each other, and each of the blocks separated from each other corresponds to at least one of the thin film transistors.

14. The pixel structure according to claim 1, wherein the metal grating polarizer layer comprises a plurality of blocks separated from each other, wherein each block is electrically connected to a corresponding thin film transistor, and the metal grating polarizer layer is used as a pixel electrode.

15. The pixel structure according to claim 1, further comprising:
   a second substrate; and
   a second metal grating polarizer layer, disposed between the first substrate and the second substrate.

16. A display panel, comprising:
   a second substrate;
   a display medium layer, disposed between the first substrate and the second substrate; and
   a pixel structure, comprising:
   a first substrate;
   a plurality of thin film transistors, disposed on an inner surface of the first substrate;
   a metal grating polarizer layer, disposed on the thin film transistors;
   a wavelength conversion layer, disposed between the inner surface of first substrate and the metal grating polarizer layer, comprising:
      a first conversion part, for receiving a light beam and converts the light beam into a first wavelength; and
      a second conversion part, for receiving the light beam and converts the light beam into a second wavelength;
      wherein the wavelength conversion layer receives the light beam between the wavelength conversion layer and the first substrate; and
   a light collimating layer, disposed between a pixel electrode and the wavelength conversion layer, wherein the light collimating layer further comprises a reflection part and a transmission part, wherein a vertical projection of the reflection part on the wavelength conversion layer is located between the first conversion part and the second conversion part.

* * * * *